(12) United States Patent
Ni et al.

(10) Patent No.: US 10,529,577 B2
(45) Date of Patent: Jan. 7, 2020

(54) DEVICE OF CHANGING GAS FLOW PATTERN AND A WAFER PROCESSING METHOD AND APPARATUS

(71) Applicant: Advanced Micro-Fabrication Equipment Inc, Shanghai, Shanghai (CN)

(72) Inventors: TuQiang Ni, Shanghai (CN); ZhiLin Huang, Shanghai (CN)

(73) Assignee: ADVANCED MICRO-FABRICATION EQUIPMENT INC. CHINA, Shanghai, Pudong (CN)

( * ) Notice: Subject to any disclaimer, the term of this patent is extended or adjusted under 35 U.S.C. 154(b) by 30 days.

(21) Appl. No.: 14/946,188

(22) Filed: Nov. 19, 2015

(65) Prior Publication Data

US 2016/0172204 A1 Jun. 16, 2016

(30) Foreign Application Priority Data

Dec. 10, 2014 (CN) .......................... 2014 1 0749979

(51) Int. Cl.
*H01L 21/3065* (2006.01)
*H01J 37/32* (2006.01)

(52) U.S. Cl.
CPC ........ *H01L 21/3065* (2013.01); *H01J 37/321* (2013.01); *H01J 37/32449* (2013.01); *H01J 37/32623* (2013.01); *H01J 37/32633* (2013.01)

(58) Field of Classification Search
CPC ........... H01J 37/32449; H01J 37/32623; H01J 37/32633; C23C 16/45591; C23C 16/45587; C23C 16/45593
See application file for complete search history.

(56) References Cited

U.S. PATENT DOCUMENTS 6,454,909 B1 * 9/2002 Matsuse ............ C23C 16/45521
118/500

* cited by examiner

*Primary Examiner* — Karla A Moore
*Assistant Examiner* — Margaret D Klunk
(74) *Attorney, Agent, or Firm* — Womble Bond Dickinson (US) LLP; Joseph Bach, Esq.

(57) ABSTRACT

The present invention relates to a device of changing the gas flow pattern in the process chamber and a wafer processing method and system; a gas introduced from the gas inlet to the process chamber will process the wafer in the process chamber; a gas center ring is set in the process chamber to adjust the gas flow pattern, which includes a fixed component under the gas inlet and above the wafer, and a movable ring could locate in the first position or the second position respectively; when the movable ring is in the first position, the gas is delivered downwards to the wafer via the first opening set on the fixed component; when the movable ring is in the second position, the gas is delivered downwards to the wafer via the second opening set on the movable ring. The present invention constitutes the gas center ring by different combinations of fixed component and movable component, to change the gas flow pattern in the process chamber, achieving effective control on the wafer processing effects and to dispense with opening the process chamber during the adjustment process of gas center ring.

11 Claims, 6 Drawing Sheets

DEVICE OF CHANGING GAS FLOW PATTERN AND A WAFER PROCESSING METHOD AND APPARATUS

FIELD OF INVENTION

The present application claims priority to and the benefit of Chinese Patent Application No. 201410749979.2, filed on Dec. 10, 2014, and the disclosure of which is hereby incorporated herein by reference in its entirety.

The present invention relates to the manufacturing equipment in semiconductor industry, especially to a device of changing the gas flow pattern in the process chamber and a wafer processing method and apparatus.

RELATED ART

The silicon etching is dominated by the chemical action, the gas delivery and flow pattern in the process chamber of etching apparatus will significantly affect the etching performance. A gas center ring (GCR), which is employed in the process chamber for silicon etching, can change the gas flow pattern in the process chamber according to the specific requirements of different etching processes.

As shown in FIG. 1, the etching apparatus comprises a process chamber 300, and a wafer 500 placed on a base 400 at bottom of the process chamber 300; during the processing, an electrostatic chuck 410 (or called ESC) on top of the base 400 will support the wafer 500, and the gas introduced into the process chamber 300 will etch or conduct other processing on the wafer 500 surface. A dielectric lid set on the top of the chamber sidewall, a RF coil connect to a RF power source and fixed upon said lid, so as to deliver the RF power into the process chamber and form plasma. If no gas center ring is equipped in the process chamber 300, after the gas is horizontally introduced from the inlet 600 which is located at upper portion of side wall of the process chamber 300, most gas will directly flow downwards along the side wall of the process chamber 300 and less gas will flow towards to the space above the wafer 500.

In contract, as shown in FIG. 2, the gas center ring 100 in the process chamber 300 is an annular structure which located under the inlet 600 and above the wafer 500; the gas is horizontally introduced from the inlet 600 and firstly horizontally flows to the central opening of the gas center ring 100 along the upper surface of the gas center ring 100, and then is delivered downwards to the corresponding wafer 500 surface under the central opening.

The most important parameters of the gas center ring to adjust the gas flow and etching effect are the central opening diameter of the gas center ring and the height between the gas center ring and the wafer surface. For example, the gas center ring with smaller opening diameter will promote the gas to flow to the position corresponding to the wafer central area; while the gas center ring with larger opening diameter, more gas will flow to the position corresponding to the wafer edge area.

The gas center ring adjusts the reactant distribution form in the process chamber (for example, increase or decrease the free radical concentration) by changing the gas flow path in the process chamber, thus achieving the adjustment of etching effect on the wafer. For example, when more gas flows to some area on the wafer surface, the etching efficiency of such area will be improved. Therefore, the gas center ring can be set to change the gas flow path to eliminate the factors which result in uniform etching effect in different wafer areas and compensate other un-uniformity parameters (such as uneven wafer temperature distribution or uneven coupling energy distribution, etc.), to achieve more uniform etching effect in different wafer areas.

However, the central opening diameter of gas center ring with the existing configuration is a fixed value. When the same process chamber (the hardware configuration of the equipment is fixed) is used to carry out different process treatment, the gas center ring with the fixed central opening diameter is unable to meet all process manufacturing requirements. Therefore, the process chamber must be opened to manually change the gas center ring with different opening diameters to adapt to different requirement, accompanied with complicated operations. In addition, once opened, the process chamber will expose to atmospheric environment, and the process chamber must be recovered to vacuum status or status before conducting the GCR replacement, which will prolong the duration of entire process procedure. Furthermore, it is difficult to confirm that whether the process conditions (pressure, temperature and coupling energy, etc.) in the process chamber are identical after each GCR replace step, which will have a significant influence on the efficiency and effects of process treatment.

SUMMARY OF THE INVENTION

The objective of the present invention is to provide a device of changing gas flow pattern in the process chamber and a wafer processing method and apparatus. The gas center ring with adjustable gas flow diameter is constituted by different combinations in shape and/or height of fixed components and movable components, to meet different process manufacturing requirements, without opening the process chamber or manually changing other gas center rings under atmospheric environment. The gas center ring in the present invention can adjust the etching effect on the wafer by changing the gas flow pattern in the process chamber.

In order to achieve above objective, the technical proposal of the present invention is to provide a device of changing the gas flow pattern in the process chamber; the gas introduced from the gas inlet to the process chamber will process the wafer in the process chamber, in which the gas inlet is located on the upper portion of the process chamber side wall; the top of the process chamber includes a lid, and a RF coil above the lid and connected to RF power supply.

The device is the gas center ring which adjusts the gas flow pattern in the process chamber; the gas center ring includes:

A fixed component is located under the gas inlet and above the wafer, and the peripheral portion of the fixed component fixed to inner wall of the process chamber, and the center portion includes a first opening;

A movable ring can be moved between first position and second position; when the movable ring is located at the first position, the gas is delivered downwards to the wafer via the first opening set on the fixed component; when the movable ring located at the second position, the gas is delivered downwards to the wafer via the second opening which is formed by combination of the movable ring and fixed component.

Preferably, the fixed component includes several passages in the area surrounding the first opening;

When the movable ring is in the first position, the gas is delivered downwards to the wafer via the first opening and passages on the fixed component;

When the movable ring is in the second position, it covers the passages to stop the gas pass through the passages, and the gas is delivered downwards to the wafer via the first opening on the fixed component;

Preferably, the movable ring can be in the third position, to cover partial areas of the first opening of the fixed component, so that the gas will be delivered downwards to the wafer via the unblocked area of the first opening.

Or, the movable ring can be in the fourth position to cover partial areas of the passages of the fixed component, so that the gas will be delivered downwards to the wafer via the unblocked area oft and passages on the fixed component.

Preferably, the fixed component comprises an outer fixed ring located outside and an inner fixed ring located in side which are connected through multiple interconnecting pieces; there are a number of passages between the outer fixed ring and inner fixed ring; when the movable ring is in the first position, the gas flows downwards through the first opening on outer fixed ring; when the movable ring is in the second position, the movable ring encloses the passages between the inner and outer fixed rings, and the gas flows downwards through the second opening on the inner fixed ring.

Preferably, when the movable ring is in the first position, after the gas passes through the first opening and passages on the fixed component, it flows into the space under the fixed component, above the movable ring and the wafer to make most gas flow to wafer edge area;

When the movable ring is in the second position, after the gas passes through the first opening on the fixed component, it flows in the space under the fixed component, above the wafer to make most gas flow to wafer central area.

Preferably, the diameter of second opening on the movable ring is equal to or larger than the wafer diameter, so that the wafer is enclosed by the movable ring in the first position;

The outer diameter of movable ring is equal to or slightly smaller than the first opening diameter of fixed component, so that the movable ring in the second position is enclosed by the first opening on fixed component.

Preferably, the outer diameter of movable ring is larger than the first opening diameter of fixed component, so that the movable ring in the second position is partially overlapped with the fixed component in vertical position.

Or, the outer diameter of movable ring is smaller than the first opening diameter of fixed component, so that there is gap for gas passing at outside of movable ring and inside of the first opening.

Preferably, the fixed component comprises a first plate to set the first opening; the fixed component further comprises the second plate connected to the side wall of the process chamber; the second plate surrounds the first plate and is connected to the first plate by the surrounding side plate.

The first plate and the second plate are in different height; the height of the first plate relative to the wafer surface is adjustable.

Preferably, the device further comprises several adjusting rod, which are connected to the movable ring and drive the movable ring to move between the first position and the second position.

Preferably, when the movable ring stays at any height between the first position and the second position, a gas flow path formed between the fixed component and the movable ring, between the movable ring and the wafer.

Preferably, the movable ring is a complete ring structure; the movable ring comprising multiple parts which move together to formed a entire ring when movable ring is in the second position, and said multiple parts moved separately to different position when movable ring is in the first position.

The second technical proposal of the present invention is to provide a wafer process apparatus, including:

A process chamber;

An gas inlet located in upper part of process chamber, the wafer processed by the gas introduced from the gas inlet to the process chamber;

A base located in the bottom of the process chamber; top is equipped with an electrostatic chuck set on top of the base to chuck the wafer placed onto it; and A gas center ring located in the process chamber to adjust the gas flow pattern; the gas center ring further comprises:

A fixed component, located under the gas inlet and above the wafer;

A movable ring, can be moved between first position and second position; when the movable ring is in the first position, the gas is delivered downwards to the wafer via the first opening set on the fixed component; when the movable ring is in the second position, the gas is delivered downwards to the wafer via the second opening set on the fixed component.

Preferably, there are several passages in the fixed component; when the movable ring is in the first position, the gas is delivered downwards to the wafer via the first opening and passages on the fixed component;

When the movable ring is in the second position, it covers the passages to prevent the gas pass\through the passages, and the gas is delivered downwards to the wafer via the first opening on the fixed component;

The third technical proposal of the present invention is to provide a wafer processing method, and the gas center ring is set in the process chamber to adjust the gas flow pattern by different combinations of fixed component and movable component;

When the movable ring is adjusted to the first position surrounding the wafer, after the gas introduced into the process chamber passes through the first opening on the fixed component, it flows in the interval passages under the fixed component, above the movable ring and wafer, so that most gas will flow to wafer edge area;

When the movable ring is adjusted to the second position to cover the first opening on the fixed component, the gas will flow through a second opening on the movable ring, it flows in the space under the fixed component, and the movable ring and above wafer, so that most gas will flow to wafer central area.

Preferably, when the movable ring is adjusted to the first position, the gas passes through the first opening and multiple on the fixed component, it flows into the space under the fixed component, movable ring and above wafer, so that most gas will flow toward the wafer edge area;

When the movable ring is adjusted to the second position, the gas passes through the first opening on the fixed component, it flows in the space under the fixed component, and above the movable ring and wafer, so that most gas will flow toward wafer central area;

In comparison with the prior art, the advantages of the present application that a device of changing gas flow pattern in the process chamber and a wafer processing method and apparatus are that: the present invention combines the fixed component and movable ring with different shapes and/or different heights to dynamically configure the gas flow diameter of the gas center ring, so as to meet various different process manufacturing requirements in the process chamber with the same system structure; the process chamber could not be opened during the adjustment of gas center ring configuration, to solve the problems encountered when the process chamber is manually opened to change the gas center ring. The device in the present invention can adjust the chemical forms in the process chamber of wafer processing apparatus (such as etching apparatus) by changing the gas flow pattern in the process chamber, to achieve effective control on wafer processing effects.

DETAILED DESCRIPTION OF THE EMBODIMENTS

The present invention provides a device to adjust the chemical reactant distribution in the process chamber by changing the gas flow pattern in the process chamber; it can be applied to the apparatus for wafer substrate etching for adjusting wafer etching effects. The present invention also provides a wafer processing method and wafer processing apparatus by using the device.

The present invention provides a gas center ring with adjustable opening diameter, which can change the gas flow pattern from gas inlet to wafer surface. To adapt to different process art requirements, the gas center ring configuration in the present invention can be adjusted in the process chamber under low pressure, without opening the process chamber during the processing procedure.

Figure 1:
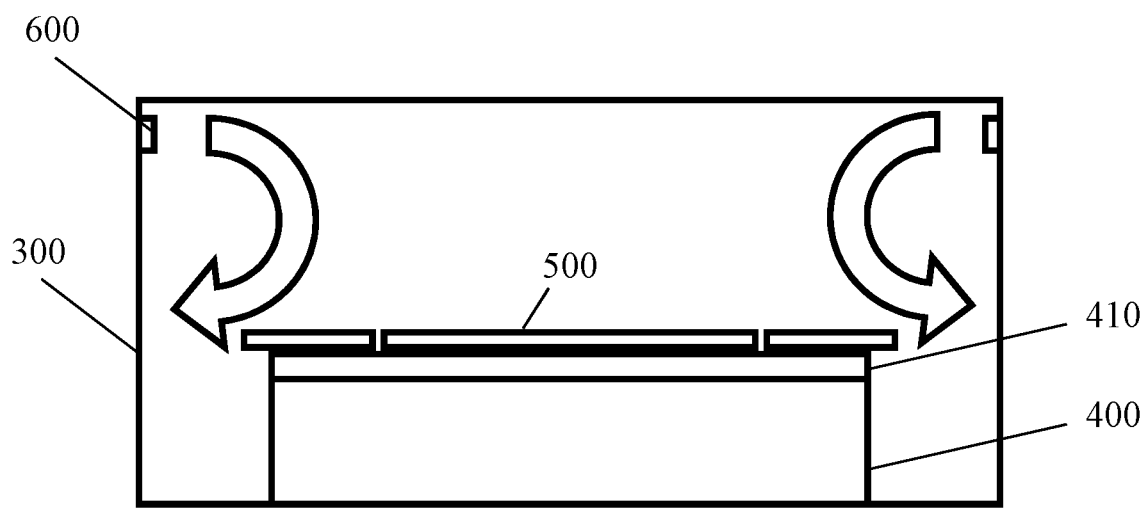
FIG. 1 is the schematic diagram of the process chamber without gas center ring in the prior art.
Figure 2:
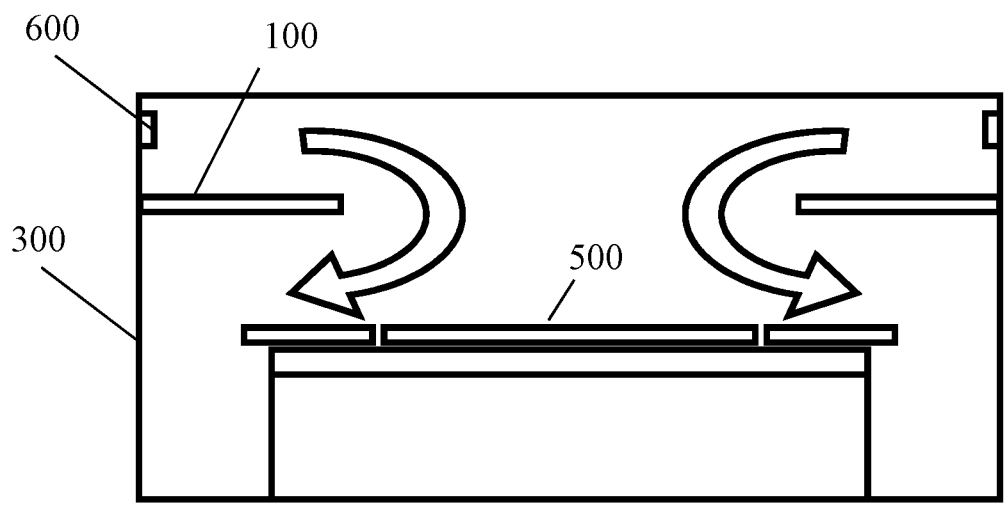
FIG. 2 is the schematic diagram of the process chamber with gas center ring in the prior art.
Figure 3:
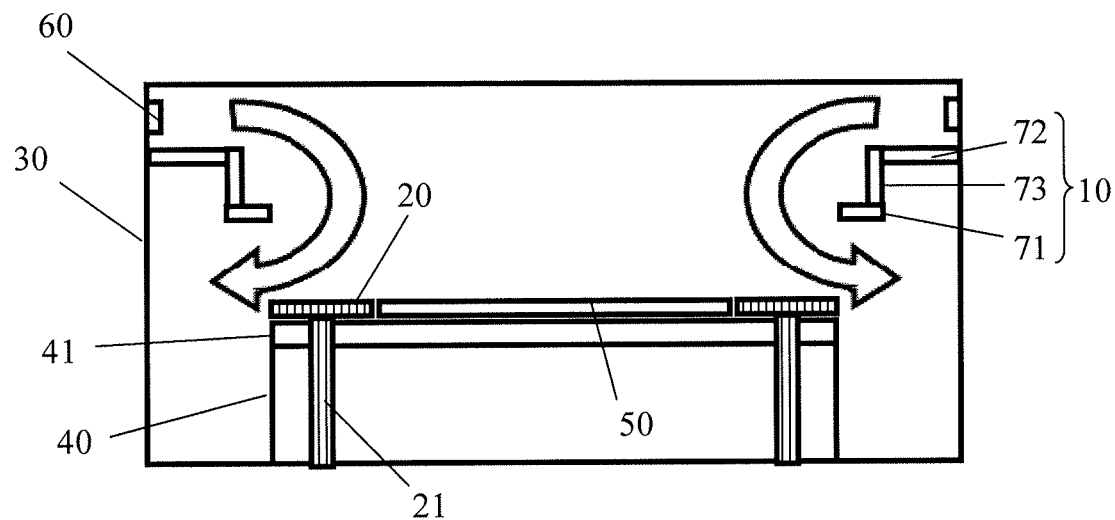
FIGS. 3 and 4 respectively are the schematic diagrams of the movable ring in different positions in the first embodiment in the present invention.
Figure 4:
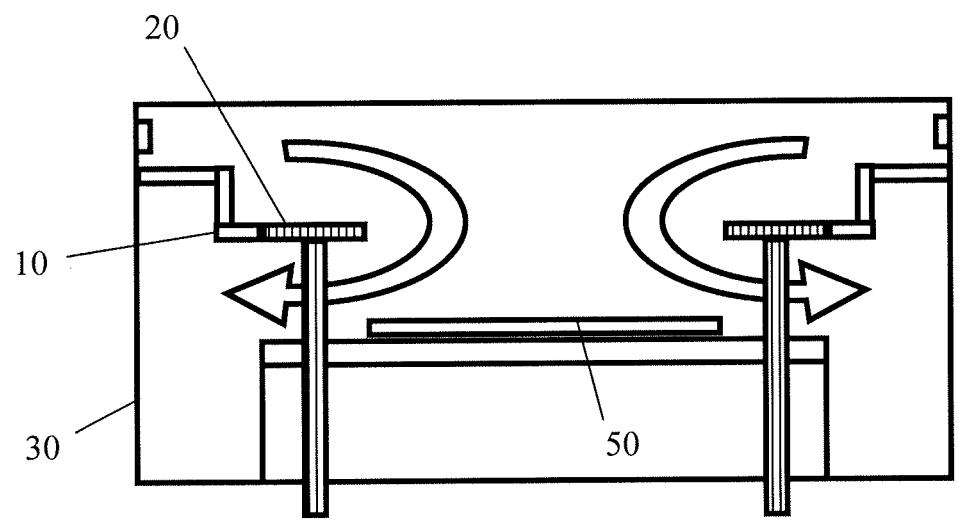
Figure 7:
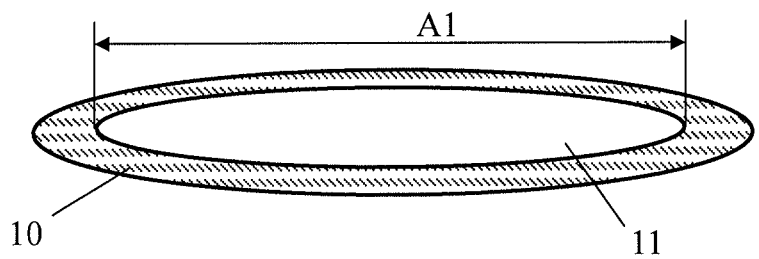
FIGS. 7 and 8 are the schematic diagrams of two different embodiment structures of the fixed component in the present invention.

As shown in FIGS. 3 and 4, the gas center ring in the present invention includes a fixed component 10 (FIG. 7), with peripheral portion fixed onto the side wall of the process chamber 30, located under an gas inlet 60 and above a wafer 50. There is a first opening 11 has the first diameter A1 in the center of fixed component 10, and the first diameter A1 in this embodiment is larger than the diameter of the wafer 50.

Figure 9:
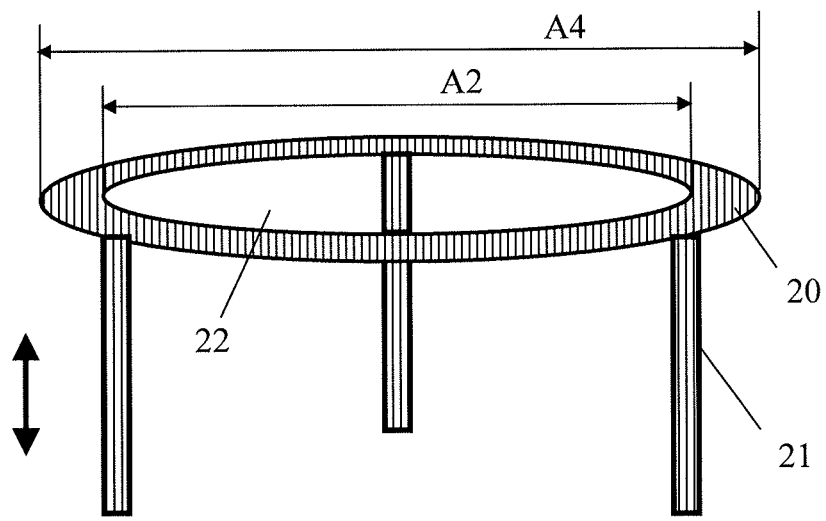
FIG. 9 is the structural schematic diagram of movable part in the present invention.

The gas center ring in the present invention also includes a movable component (FIG. 9) and the main body is a movable ring 20; plural adjusting rod 21 (for example 3 ones) is located under the movable ring 20, which is used to drive the movable ring 20 to raise or drop. There is a second opening 22 has the second diameter A2 in the center of movable ring 20, and the second diameter A2 in this embodiment is larger than the diameter of the wafer 50.

As shown in FIG. 3, when the movable ring 20 drop to the first position, it will enclose the wafer 50. At this time, the movable ring 20 in the first position is located on the wafer supporting mechanism; the wafer supporting mechanism is generally an electrostatic chuck 41 (or called ESC) on a base 40 at the bottom of the process chamber 30, which will hold the wafer 50 during the process treatment.

Thus, when the gas is introduced into the process chamber 30 through the gas inlet 60, it horizontally flows to the first opening 11 of the fixed component along the upper surface of fixed component 10 and then is delivered to the lower space of the chamber 30 via the first opening 11. That is to say, the introduced gas passes through the first opening 11 of the fixed component 10, and flows into the space under the fixed component 10, and above the wafer 50 and movable ring 20, thus more gas will flow to the wafer edge area, or even to the places away from the wafer 50.

The outer diameter A4 of the moving ring 20 is designed adapt to the first diameter A1 (the diameter of the first opening 11 of fixed component 10). In this embodiment, the outer diameter A4 of the moving ring 20 is equal to or slightly smaller than the first diameter A1 of the first opening 11 of fixed component 10. As shown in FIG. 4, when the movable ring 20 raise to the second position, it can be filled into the first opening 11 of the fixed component 10. Therefore, the introduced gas horizontally flows to the second opening 22 of movable ring 20 along the upper surface of fixed component 10 and the movable ring 20, and flow downward to corresponding wafer 50 surface via the second opening 22; that is, after the introduced gas passes through the second opening 22 of movable ring 20, it flows into the space under the fixed component 10, movable ring 20 and above wafer 50, to make more gas flow toward the wafer central area.

Figure 5:
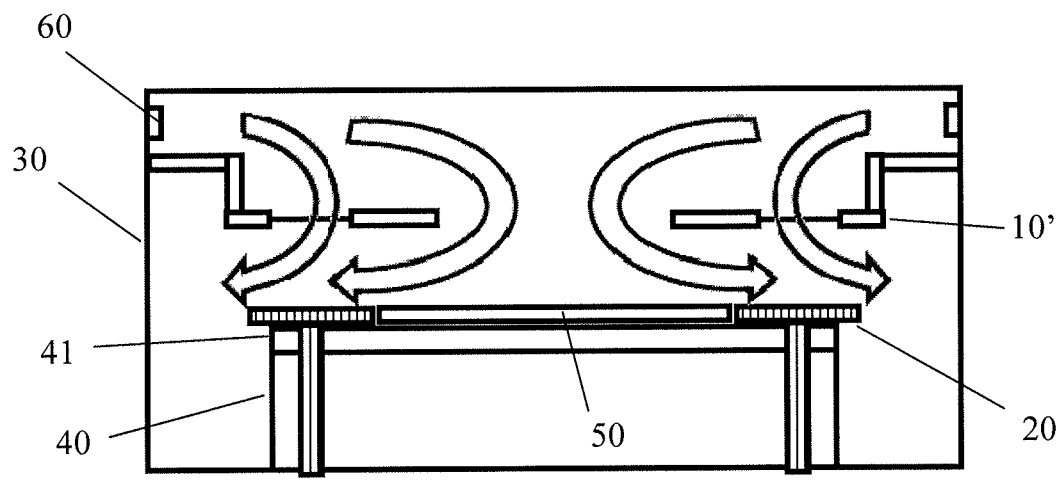
FIGS. 5 and 6 respectively are the schematic diagrams of the movable ring in different positions in the second embodiment in the present invention.
Figure 6:
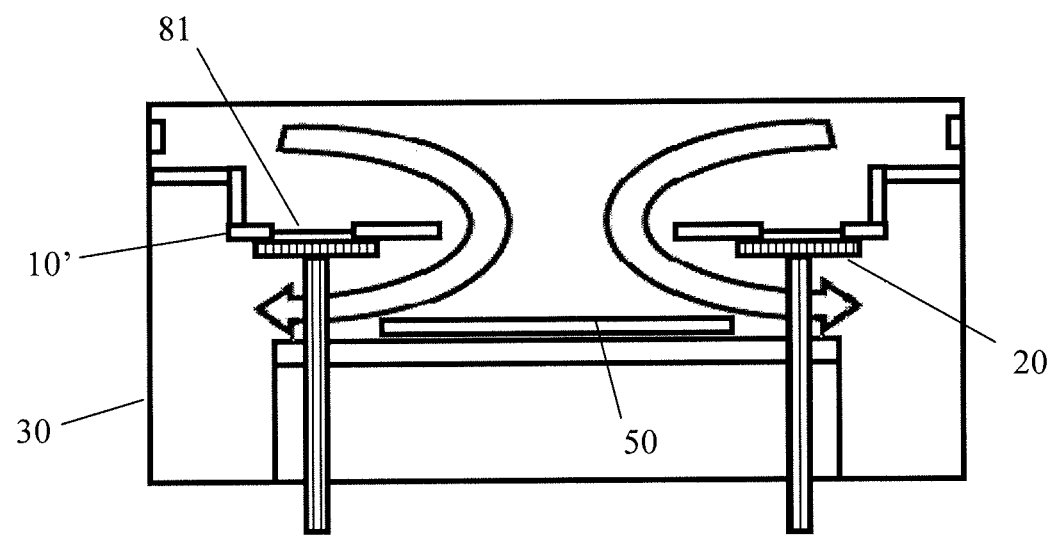
Figure 8:
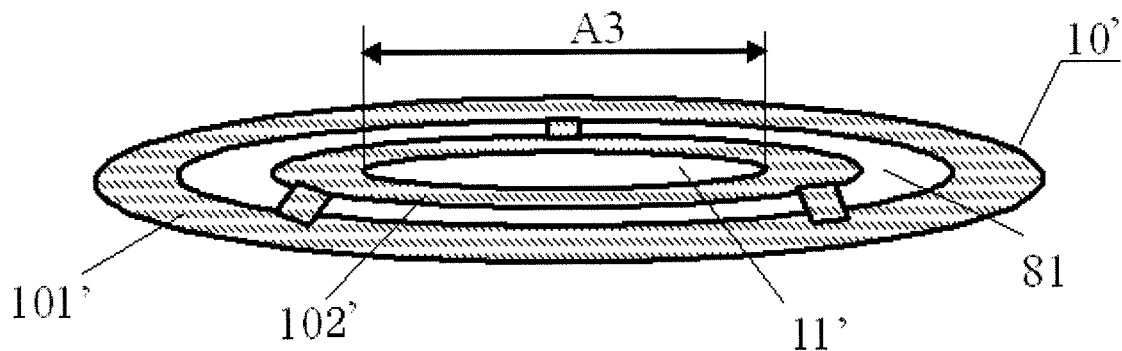

In another embodiment as shown in FIGS. 5, 6 and 8, in addition to the first opening 11' in the center of fixed component 10', there are several passages 81 (FIG. 8) penetrating the fixed component 10'. These passages 81 are distributed in the ring area surrounding the first opening 11' on the fixed component 10'; three arc-shaped passages 81 as shown in the drawing have no restriction on the quantity, shape or layout of passages 81 on the fixed component 10'; the passages 81 could be in the form of groove and hole.

In this embodiment, corresponding areas right under these passages 81 are beyond the wafer 50 boundary, corresponding to the position of the movable ring 20. As shown in FIG. 6, when the movable ring 20 ascends to the second position to completely cover these passages 81, the gas can only be delivered downwards through the first opening 11' on fixed component 10', and the gas flows in the interval gasps under the fixed component 10', movable ring 20 and above the wafer 50, to make more gas flow to the wafer central area.

As shown in FIG. 5, when the movable ring 20 descends to the first position, the gas could be delivered downwards simultaneously through the first opening 11' on fixed component 10' and passages 81, and the gas flows in the interval passages under the fixed component 10', above the movable ring 20 and the wafer 50; even the first opening 11' exists in the center of fixed component 10', and further the first opening 11' has a diameter A3 smaller than wafer 50 diameter, still more gas will flow to the wafer edge area or even the places away from the wafer 50.

In above embodiments, taking FIG. 3 as an example, there is a first plate 71 on the fixed component 10 and 10', and the first opening 11 and passages 81 set on the first plate 71; in addition, the fixed component 10 also has a second plate 71 which is connected to the side wall of process chamber 30;

the second plate 72 is surrounded around the first plate 71; in this embodiment, the second plate 72 is higher than the first plate 71 in the vertical direction (the second plate may be lower than the first plate in other embodiments); the first plate 71 and the second plate 72 are connected by a side plate 73. The height relative to the wafer 50 surface of the first plate 71 on fixed component 10 and 10' is considered as a control parameter to achieve gas flow pattern adjustment. The height relative to wafer 50 surface of the first plate 71 can be controlled by modifying the height difference between the first plate 71 and the second plate 72, for example, by modifying the height of side plate 73 (using the side plate 73 with different height or set the side plate 73 could be moved between upper and lower position), to meet the corresponding process recipe requirements.

Another control parameter for gas flow pattern adjustment is the diameter size of the opening for gas passing through. According to the embodiments, the opening diameter is determined by the first opening diameter of fixed component (the first diameter A1 or the third diameter A3), the second opening 22 diameter of the movable ring 20 (the second diameter A2), the setting of passages 81 on fixed component 10' and other comprehensive factors. For example, in the embodiments as shown in FIGS. 3 and 4, by selecting different combinations of fixed component 10 and movable ring 20, the opening diameter of the gas center ring can be adjusted to the first diameter A1 of the first opening 11 on larger fixed component, or adjusted to the second diameter A2 of the second opening 22 of smaller movable ring 20. Another example can be found in embodiments as shown in FIGS. 5-8, by different combinations of fixed component 10' and the movable ring 20, the opening diameter of the gas center ring can be adjusted to the diameter of passages 81 A1 on the outer fixed component 101' (Plus the third diameter A3 of the first opening 11' on the inner fixed component 102'), or adjusted to the third diameter A3 of the first opening 11' of the smaller fixed component 10'. As shown in FIG. 8, the fixed component 10' includes a outer fixed ring 101' and an inner fixed ring 102', which are connected through multiple interconnecting pieces; the opening diameter of outer fixed ring is A1 (A1 is larger than the diameter of the substrate), the opening diameter of inner fixed ring is A3 (A3 is smaller than the diameter of the substrate). The width of inner fixed ring can be designed very narrow, so that plural interconnecting pieces and inner fixed ring will not block the gas penetrate the larger opening of outer fixed ring and flow downwards when the movable ring is at lower position; when the movable ring moves upwards and block the passages 81 between outer and inner fixed rings, the gas channel with opening diameter A3 will be formed. Thus, the opening diameter of the gas center ring can be switched between two working modes: larger than the substrate diameter (A1) or smaller than the substrate diameter (A3), to enlarge the adjusting range of the gas center ring; meanwhile, it will not affect the maximum gas flow rate when the gas center ring is at the maximum opening A1. The horizontal width of inner fixed ring shall be smaller than 20% of the first opening diameter to ensure that it will not affect the gas flowing when the opening is maximized.

The device of the present invention may have other different structures design, which can be mutually combined or combined with the above embodiments, to provide different controls on the gas flow pattern. For example, the fixed component 10" can be a simple ring (FIG. 10), and the gas flow path diameter of gas center ring can be changed by adjusting the upper and lower position of adjustable ring 20.

Figure 10:
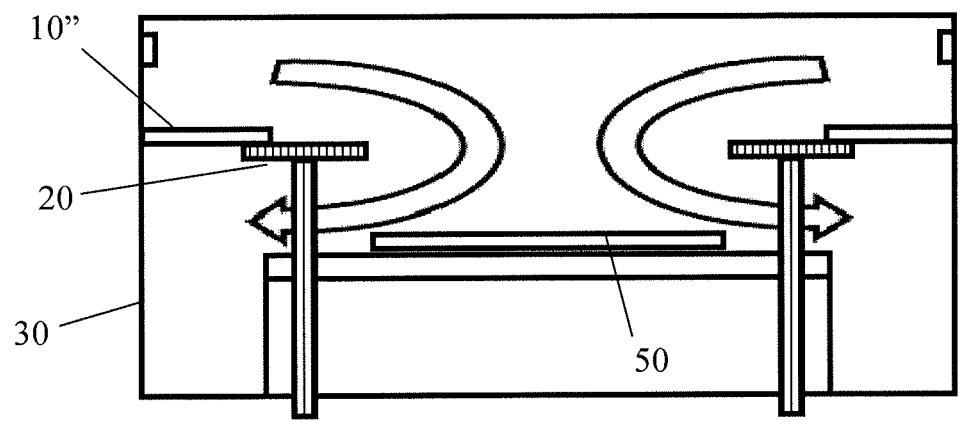
FIG. 10 is the schematic diagram of the first combination between the fixed component and moveable ring in the present invention.

For example, the outer diameter of movable ring 20 can be larger than the diameter of first opening 11 on the fixed component 10, so the movable ring ascends to contact or near to lower surface of fixed component 10, that is, the movable ring 20 and the fixed component 10 are stacked, and these two have overlapping part (FIG. 10).

Figure 11:
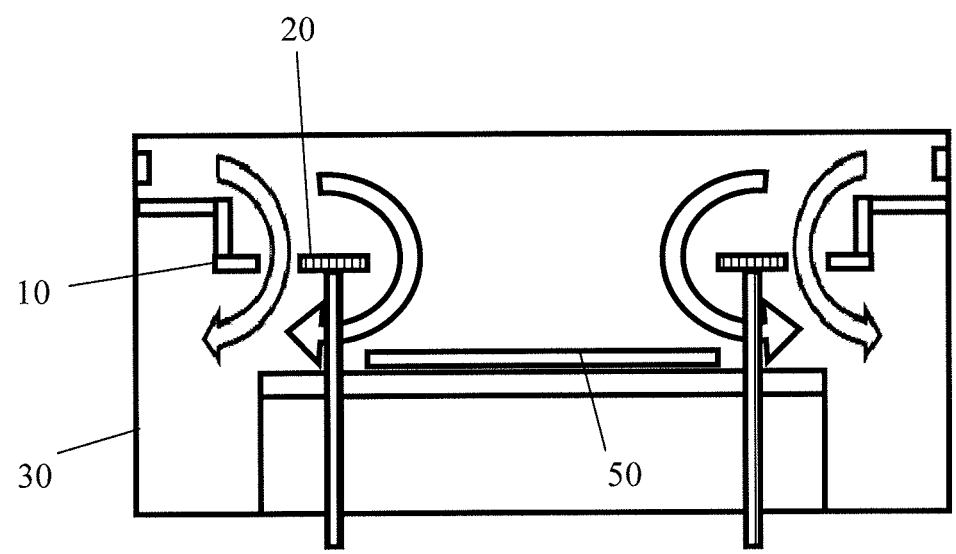
FIG. 11 is the schematic diagram of the second combination between the fixed component and moveable ring in the present invention.

Or, the outer diameter of movable ring 20 can be smaller than the diameter (A1 or A3) of first opening on fixed component, there is gap for gas passing between the raised movable ring 20 and the inner side of first opening. By adjustment, the gas can only flow through the first opening of fixed component or simultaneously flow through the gap and the second opening 22 of the movable ring 20 (FIG. 11).

Figure 12:
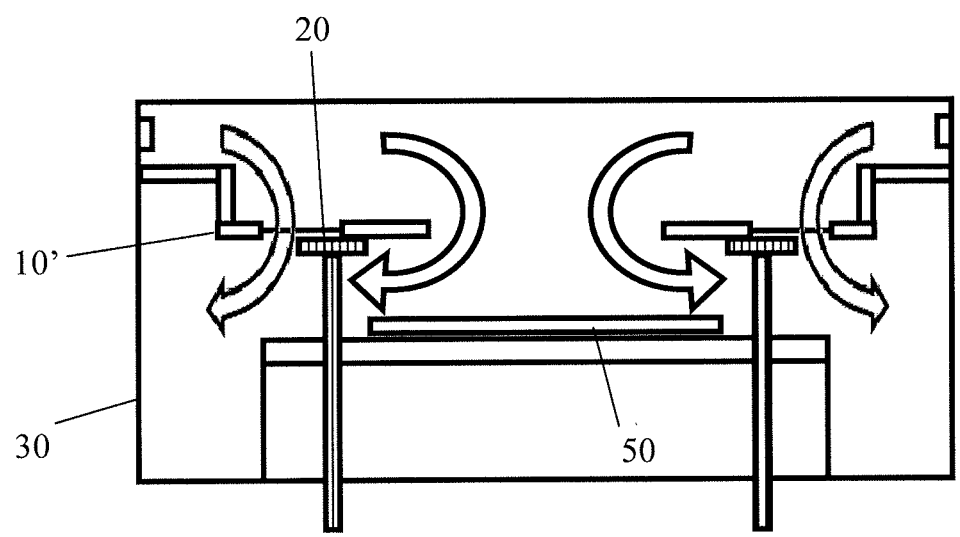
FIG. 12 is the schematic diagram of the third combination between the fixed component and moveable ring in the present invention.

For example, the width of movable ring 20 is configurable, so that the ascending movable ring 20 could be designed to cover partial of the passages 81, while the gas can flow simultaneously through the passages 81 and the first opening 11' of the fixed component 10' (FIG. 12); however, the gas flow rate and other parameters can be adjusted to get a different gas distribution from the second embodiment (FIG. 5).

For example, the movable ring is adjusted to stay at any position between the first position and the second position; different gas flow paths can be formed between the fixed component and movable ring, and between the movable ring and the wafer, to achieve additional control Knob on the gas flow pattern. When it is unnecessary to move the movable ring to the lowest position (the first position surrounding the wafer), the second diameter of the movable ring opening can be designed to be smaller than the wafer.

For example, the adjusting rod can be set onto the lid of the chamber and has a lifting rod extend downward to connected onto upper surface of the movable ring, and the movable ring descends to the second position to match the first opening on fixed component, or the movable ring ascends to the lid of process chamber to be away from the fixed component. Or, the adjusting rod is horizontally configured to drive the movable ring to horizontally move between the position cover the opening of fixed component and the position away from the fixed component. Or, the movable ring includes multiple arc-shaped parts, which could moved together to form an entire movable ring match to the opening of fixed component, later the multiple parts could be separated and stored in different positions in the process chamber, etc.

In conclusion, the present invention supply a gas center ring with a diameter configurable gas flow opening by configuring different combinations of fixed component and movable ring; the gas center ring with smaller opening diameter will guide more gas flow to wafer central area; while the gas center ring with larger opening diameter will guide more gas flow to wafer edge area or away from the wafer. The gas center ring with different diameters can be used to effectively change the gas flow path in the process chamber, to adjust the chemical reactant distribution in the process chamber, thus optimally adapting to the specific etching process and obtaining the best performance, such as the etching rate or critical dimension (CD) uniformity. Besides the etching tool, the device of the present invention can be applied to other wafer processing apparatus, by adjusting the gas flow pattern to form different wafer processing effects in said wafer processing apparatus. When the present invention adjusts the gas center ring diameter to adapt to different process recipe requirements, it could be automatically achieved in the process chamber under processing pressure, which could solve the problem encountered when the process chamber is manually opened to replace the gas center ring.

While the preferred embodiments have been chosen to illustrate the present invention, the above description shall not be deemed as the limitation to the present invention. It will be apparent to the people skilled in the art from this disclosure that various change and modification can be made herein. Therefore, the protection scope of the present invention shall be defined by the appended claims.

The invention claimed is:

1. A wafer processing apparatus, comprising:
a process chamber having a side wall, a wafer support, a gas inlet, and a device for changing the gas flow pattern in the process chamber; based on the gas introduced from the gas inlet to the process chamber, in which the gas inlet is located on the upper portion of the process chamber side wall; wherein
the device includes:
a fixed ring, which is located under the gas inlet and above the wafer support, and is fixed to the side wall, and having a first opening of first diameter;
a movable ring that can be moved between a first position on the wafer support below the fixed ring and a second position, raised from the first position, the movable ring having outer diameter which is equal to or slightly smaller than the first diameter and having a second opening of a second diameter which is smaller than the first diameter;
wherein when the movable ring is located at the first position, the gas is delivered from the gas inlet, through the first opening, and then flows into a space under the fixed ring and above the wafer support and movable ring; and when the movable ring is located at the second position, the gas is delivered from the gas inlet, through the second opening, and into a space under the fixed ring and the movable ring and above the wafer support, thereby causing more gas to flow towards central area of the wafer, and wherein gas flows through the second opening towards the wafer only when the movable ring is located at the second position.

2. The device of claim 1, wherein diameter of a second opening on the movable ring is equal to or larger than diameter of the wafer, so that the wafer is enclosed by the movable ring in the first position.

3. The device of claim 1, wherein the fixed ring comprises a first plate having the first opening; the fixed ring further comprises a second plate connected to the side wall; the second plate surrounds the first plate and connects to the first plate by a side-plate; the first plate and the second plate are in different height; the height of the first plate relative to surface of the wafer support is adjustable.

4. The device of claim 1, wherein the device further comprises several adjusting rods, which are connected to the movable ring and drive the movable ring to move the movable ring between the first position and the second position.

5. The device of claim 1, wherein, when the movable ring stays at any height between the first position and the second position, a gas flow path is formed between the fixed ring and the movable ring, and between the movable ring and the wafer.

6. The device of claim 1, wherein the movable ring comprises multiple parts which move together to form an entire ring when the movable ring is in the second position, and said multiple parts are moved separately to different position when movable ring is in the first position.

7. A wafer processing apparatus comprising:
a process chamber having a side wall, a wafer support, a gas inlet;
a fixed ring attached to the side wall under the gas inlet and above the wafer support and having a first opening of first diameter,
a movable ring that can be moved between a first position on the wafer support below the fixed ring and a second position, raised from the first position, and having a second opening of a second diameter which is smaller than the first diameter;
wherein, the fixed ring includes several passages in the area surrounding the first opening; when the movable ring is in the first position, the gas is delivered downwards to the wafer via the first opening and the passages on the fixed ring; when the movable ring is in the second position, it covers the passages to stop the gas passing through the passages, and the gas is delivered downwards to the wafer via the first opening on the fixed ring.

8. The wafer processing apparatus of claim 7, wherein, the movable ring can also be in the third position, to cover partial areas of the first opening of the fixed ring, so that the gas will be delivered downwards to the wafer via the unblocked area of the first opening; or, the movable ring can also be in the fourth position to cover partial areas of the passages of the fixed ring, so that the gas will be delivered downwards to the wafer via the uncovered area of and passages and the first opening on the fixed ring.

9. The wafer processing apparatus of claim 7, wherein, the fixed ring comprises an outer fixed ring and an inner fixed ring located inside the outer fixed ring, and they are connected through multiple interconnecting pieces thereby forming the several passages between the outer fixed ring and inner fixed ring; when the movable ring is in the first position, the gas flows downwards through the first opening on the outer fixed ring; when the movable ring is in the second position, the movable ring cover the passages between the inner fixed ring and the outer fixed ring.

10. The wafer processing apparatus of claim 7, wherein, when the movable ring is in the first position, after the gas passes through the first opening and the passages on the fixed ring, it flows into the space under the fixed ring, above the movable ring and the wafer, to make the most gas flow to the wafer edge area; when the movable ring is in the second position, after the gas passes through the first opening on the fixed ring, it flows into the space under the fixed ring and said movable ring, above the wafer, to make the most gas flows to the wafer central area.

11. The device of claim 7, wherein an outside diameter of the movable ring is larger than a diameter of the first opening of the fixed ring so that the movable ring in the second position is partially overlapped with the fixed ring at the vertical direction.

* * * * *